(12) United States Patent
Jeon et al.

(10) Patent No.: US 8,471,803 B2
(45) Date of Patent: Jun. 25, 2013

(54) LEVEL SHIFTERS INCLUDING CIRCUITRY FOR REDUCING SHORT CIRCUITS AND DISPLAY DEVICES USING THE SAME

(75) Inventors: Woo-chol Jeon, Guri-si (KR); Jae-bum Choi, Goyang-si (KR)

(73) Assignee: Samsung Electronics Co., Ltd. (KR)

( * ) Notice: Subject to any disclaimer, the term of this patent is extended or adjusted under 35 U.S.C. 154(b) by 410 days.

(21) Appl. No.: 12/837,608

(22) Filed: Jul. 16, 2010

(65) Prior Publication Data

US 2011/0025734 A1 Feb. 3, 2011

(30) Foreign Application Priority Data

Jul. 29, 2009 (KR) ........................ 10-2009-0069495

(51) Int. Cl.
G09G 3/36 (2006.01)
G09G 5/00 (2006.01)
H03L 5/00 (2006.01)

(52) U.S. Cl.
USPC .............................. 345/98; 345/204; 327/333

(58) Field of Classification Search
USPC ..................................... 345/204, 98; 327/333
See application file for complete search history.

(56) References Cited

U.S. PATENT DOCUMENTS

| | | | | |
|---|---|---|---|---|
| 4,437,024 A * | 3/1984 | Wacyk | .............................. | 326/71 |
| 5,151,620 A * | 9/1992 | Lin | .................................. | 326/71 |
| 5,304,867 A * | 4/1994 | Morris | ............................ | 326/71 |
| 5,565,795 A * | 10/1996 | Kawano | ........................... | 326/81 |
| 5,955,893 A * | 9/1999 | Chang et al. | ..................... | 326/71 |
| 6,323,701 B1 * | 11/2001 | Gradinariu et al. | .............. | 326/83 |
| 6,429,683 B1 * | 8/2002 | Miller et al. | ..................... | 326/81 |
| 7,119,578 B2 * | 10/2006 | Correale et al. | .............. | 327/333 |
| 7,336,100 B2 * | 2/2008 | Correale et al. | ................. | 326/71 |
| 7,525,367 B2 * | 4/2009 | Behrends et al. | ............. | 327/333 |
| 2002/0118040 A1 * | 8/2002 | Salminen | ......................... | 326/81 |
| 2004/0174201 A1 * | 9/2004 | Roberts et al. | ................ | 327/333 |
| 2005/0179480 A1 * | 8/2005 | Shin | .............................. | 327/333 |
| 2006/0261862 A1 * | 11/2006 | Baszler et al. | ................ | 327/333 |
| 2008/0084231 A1 * | 4/2008 | Behrends et al. | .............. | 326/68 |
| 2008/0084237 A1 * | 4/2008 | Behrends et al. | ............. | 327/333 |

FOREIGN PATENT DOCUMENTS

| | | |
|---|---|---|
| JP | 2004-228879 | 8/2004 |
| JP | 2006-050287 | 2/2006 |
| JP | 2006-050288 | 2/2006 |

* cited by examiner

*Primary Examiner* — Adam J Snyder
(74) *Attorney, Agent, or Firm* — Myers Bigel Sibley & Sajovec

(57) ABSTRACT

Provided are a level shifter and a display device including the level shifter. The level shifter includes: a first circuit that blocks a supply of a source voltage to a first node while a signal input to an input terminal is maintained at a logic high level, and that supplies the source voltage to the first node while the signal input to the input terminal is transitioned from a logic high level to a logic low level; a second circuit that supplies the source voltage to the first node only when a voltage of an output terminal is maintained at a logic low level; a first inverter that reverses a logical level of the signal input to the input terminal by using the voltage supplied from the first node and outputs the signal to a second node; and a second inverter that reverses the logical level of the signal input to the second node by using the source voltage and outputs the signal to the output terminal.

15 Claims, 3 Drawing Sheets

LEVEL SHIFTERS INCLUDING CIRCUITRY FOR REDUCING SHORT CIRCUITS AND DISPLAY DEVICES USING THE SAME

CROSS-REFERENCE TO RELATED APPLICATIONS

This application claims priority under 35 U.S.C. §119 of Korean Patent Application No. 10-2009-0069495, filed on Jul. 29, 2009, in the Korean Intellectual Property Office, the disclosure of which is incorporated herein in its entirety by reference.

BACKGROUND

The inventive concept relates to level shifters and to display devices that include such level shifters.

Applications that require various source voltages may be included in a single electronic circuit. Accordingly, in order to interface between the applications, a level shifter that converts a voltage level of a signal may be used.

SUMMARY

Embodiments of the inventive concept provide level shifters that are capable of applying a wide range of source voltages by using a single voltage source.

Embodiments of the inventive concept also provides a display device using the level shifter.

According to some embodiments, level shifters may be provided that include a first circuit that is configured to block a supply of a source voltage to a first node while a signal input to an input terminal is maintained at a logic high level, and to supply the source voltage to the first node while the signal input to the input terminal transitions from a logic high level to a logic low level; a second circuit that is configured to supply the source voltage to the first node only when a voltage of an output terminal is maintained at a logic low level; a first inverter that uses the voltage supplied from the first node to generate a first output signal by reversing a logical level of the signal input to the input terminal and outputs the first output signal to a second node; and a second inverter that uses the source voltage to generate a second output signal by reversing the logical level of the first output signal that is output to the second node and outputs the second output signal to the output terminal.

The first circuit may comprise: a first P-channel transistor comprising a source terminal connected to a source voltage terminal, a drain terminal connected to a third node, and a gate terminal connected to a terminal that is maintained at a logic low state; a second P-channel transistor comprising a source terminal connected to the source voltage terminal, a drain terminal connected to the first node, and a gate terminal connected to the third node; and a first capacitor comprising a first terminal connected to the input terminal, and a second terminal connected to the third node.

The terminal that is maintained at a logic low state may comprise a ground terminal.

The second circuit may comprise a third P-channel transistor comprising a source terminal connected to the source voltage terminal, a drain terminal connected to the first node, and a gate terminal connected to the output terminal.

The level shifter may further comprise a second capacitor comprising a first terminal connected to the source voltage terminal and a second terminal connected to the first node.

The first inverter may comprise: a fifth P-channel transistor comprising a gate terminal connected to the input terminal, a source terminal connected to the first node, and a drain terminal connected to the second node; and a first N-channel transistor comprising a gate terminal connected to the input terminal, a drain terminal connected to the second node, and a source terminal to the ground terminal.

The second inverter may comprise: a fourth P-channel transistor comprising a gate terminal connected to the second node, a source terminal connected to the source voltage terminal, and a drain terminal connected to the output terminal; and a second N-channel transistor comprising a gate terminal connected to the second node, a drain terminal connected to the output terminal, and a source terminal connected to the ground terminal.

The first capacitor and the second capacitor may comprise metal-oxide-semiconductor (MOS) devices.

According to further embodiments, display devices may be provided that include a panel comprising a plurality of pixel arrays and a first driving circuit for driving the plurality of pixel arrays; a second driving circuit generating a signal for driving the panel; and a level shifter that is configured to convert a voltage level of the signal generated by the second driving circuit to a voltage level for driving the first driving circuit, wherein the level shifter comprises: a first circuit that is configured to block a supply of a source voltage to a first node while a signal input to an input terminal is maintained at a logic high level and to supply a source voltage to the first node while the signal input to the input terminal is transitioned from a logic high level to a logic low level; a second circuit that is configured to supply the source voltage to the first node only when a voltage of an output terminal is maintained at a logic low level; a first inverter that uses the voltage supplied from the first node to generate a first output signal by reversing a logical level of the signal input to the input terminal and outputs the first output signal to a second node; and a second inverter that uses the source voltage to generate a second output signal by reversing the logical level of the first output signal that is output to the second node and outputs the second output signal to the output terminal.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

All embodiments can be combined in any way and/or combination.

The inventive concept provides a level shifter that may shift a voltage level of an input signal using a single source voltage VDDH (which has a voltage that is equal to the logic high level of the output signal of the level shifter), as opposed to by using both a source voltage VDDL that has a voltage of an input signal and the source voltage VDDH.

Figure 1:
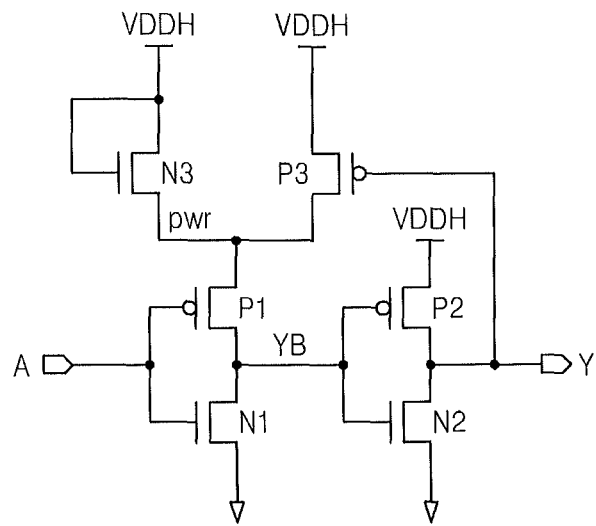
FIG. 1 is a circuit diagram illustrating a level shifter according to an embodiment of the inventive concept.

FIG. 1 is a circuit diagram illustrating a level shifter according to an embodiment of the inventive concept.

Referring to FIG. 1, the level shifter includes a plurality of p-channel metal-oxide-semiconductor (PMOS) transistors P1, P2, and P3, and a plurality of n-channel metal-oxide-semiconductor (NMOS) transistors N1, N2, and N3.

The PMOS transistor P1 and the NMOS transistor N1 are complimentarily connected to each other to form a first inverter. The PMOS transistor P2 and the NMOS transistor N2 are likewise complimentarily connected to each other to form a second inverter.

The NMOS transistor N3 and the PMOS transistor P3 supply or block a source voltage VDDH to a node pwr. The node pwr is the source terminal of the PMOS transistor P1.

The level shifter of FIG. 1 may operate as follows.

A signal that swings from a logic low level of 0 V to a logic high level of a voltage VDDL is input to an input terminal A of the level shifter. The voltage VDDL is lower than the source voltage VDDH.

The gate terminal and the source terminal of the NMOS transistor N3 are connected to each other so that the NMOS transistor N3 operates as a diode, and the NMOS transistor N3 supplies a voltage (VDDH-Vthn) to the node pwr, where the voltage Vthn refers to a threshold voltage of an NMOS transistor, and the voltage Vthp (discussed below) refers to a threshold voltage of a PMOS transistor.

When a signal input to the input terminal A is 0 V, that is, logic low level, the PMOS transistor P1 is turned on and the NMOS transistor N1 is turned off, thereby pulling up a voltage at a node YB to a voltage identical to the node pwr. Thus, under these circumstances, the node YB has a voltage (VDDH-Vthn). Accordingly, the PMOS transistor P2 is turned off, and the NMOS transistor N2 is turned on, and thus, a voltage of the output terminal Y is 0 V.

When the voltage of the output terminal Y is reduced to 0 V, the PMOS transistor P3 is turned on, thereby raising the node pwr to the source voltage VDDH, and the voltage of the node pwr is supplied to the source terminal of the PMOS transistor P1. Accordingly, a stable logical state is maintained by raising the voltage of the node YB up to the source voltage VDDH.

When the signal input to the input terminal A has a voltage VDDL, that is, logic high level, and the voltage VDDL is higher than the voltage (VDDH-Vthn-Vthp), the PMOS transistor P1 is turned off, and the NMOS transistor N1 is turned on, and the voltage of the node YB is pulled down to 0 V. Accordingly, the PMOS transistor P2 is turned on, and the NMOS transistor N2 is turned off. Consequently, the voltage of the output terminal Y is raised to the source voltage VDDH.

Accordingly, a signal input at the input terminal A that swings from 0 V to the voltage VDDL is converted to a signal that swings from 0 V to the source voltage VDDH by the level shifter circuit of FIG. 1.

However, if an input signal to the level shifter circuit of FIG. 1 is logic high level and the voltage of the input signal is lower than the source voltage VDDH of the inverter by Vthp, both the PMOS transistor P1 and the NMOS transistor N1 of the first inverter are turned on, thereby generating a short circuit between the node pwr and ground.

In order to reduce the occurrence of such a short circuit, the signal present at the output terminal Y is fed back to the gate of the PMOS transistor P3 while the signal of the input terminal A has a voltage of a logic high level, thereby blocking the PMOS transistor P3. In this manner, the short circuit may be prevented while the input signal is logic high.

However, if a signal input to the input terminal A is the voltage VDDL, which is logic high, and the voltage VDDL is lower than a voltage (VDDH-Vthn-Vthp), the NMOS transistor N3, the PMOS transistor P1, and the NMOS transistor N1 may all be turned on, thereby generating a short circuit. The short circuit may not be temporary but continuous so long as the input signal is maintained at a logic high level.

Figure 2:
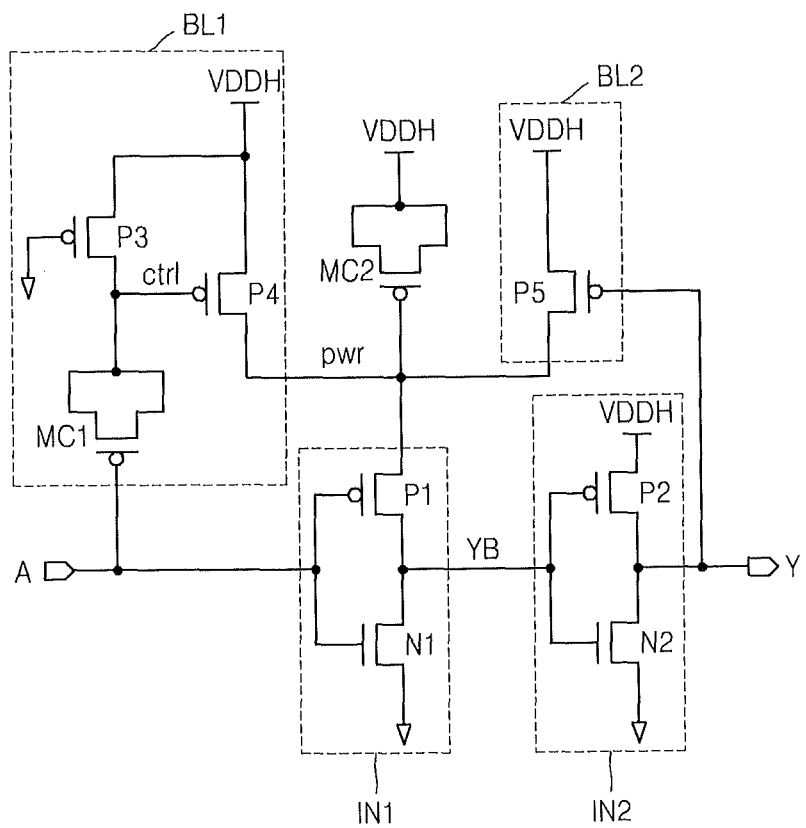
FIG. 2 is a circuit diagram illustrating a level shifter according to another embodiment of the inventive concept.

According to another embodiment of the inventive concept, a level shifter is provided that may reduce or prevent the occurrence of the short circuit situation described above. FIG. 2 is a circuit diagram illustrating such a level shifter.

Referring to FIG. 2, the level shifter includes PMOS transistors P1 through P5, NMOS transistors N1 and N2, and capacitors MC1 and MC2.

As shown in FIG. 2, the PMOS transistor P1 and the NMOS transistor N1 are complimentarily connected to each other to form a first inverter IN1 that reverses a logical state of a signal input at the input terminal A. A gate terminal of the PMOS transistor P1 is connected to the input terminal A, and a source terminal thereof is connected to a node pwr, and a drain terminal thereof is connected to a node YB. A gate terminal of the NMOS transistor N1 is connected to the input terminal A, and a drain terminal thereof is connected to the node YB, and a source terminal thereof is connected to a ground terminal.

The PMOS transistor P2 and the NMOS transistor N2 are complimentarily connected to each other, thereby forming a second inverter IN2 that reverses a logical state of a signal input at the node YB. A gate terminal of the PMOS transistor P2 is connected to the node YB, and a source terminal thereof is connected to a source voltage VDDH, and a drain terminal thereof is connected to an output terminal Y. A gate terminal of the NMOS transistor N2 is connected to the node YB, and a drain terminal thereof is connected to the output terminal Y, and a source terminal thereof is connected to the ground terminal.

When the voltage of the input terminal A is maintained at a logic high level, a first circuit BL1 blocks the source voltage VDDH from being supplied to the node pwr. When the voltage of the input terminal A is transitioned from a logic high to a logic low, the first circuit BL1 supplies the source voltage VDDH to the node pwr.

Specifically, the first circuit BL1 is formed of the PMOS transistors P3 and P4 and the capacitor MC1. A gate terminal of the PMOS transistor P3 is connected to the ground terminal, and a source terminal thereof is connected to the source voltage VDDH, and a drain terminal thereof is connected to a node ctrl. A gate terminal of the PMOS transistor P4 is connected to the node ctrl, and a source terminal thereof is connected to the source voltage VDDH, and a drain terminal thereof is connected to the node pwr. The capacitor MC1 may be formed, for example, by connecting the source terminal and the drain terminal of a PMOS transistor. The capacitor MC1 is a coupling capacitor, wherein a first terminal thereof is connected to the input terminal A, and a second terminal thereof is connected to the node ctrl.

A second circuit BL2 supplies the source voltage VDDH to the node pwr only when the voltage of the output terminal Y is maintained at a logic low level. Specifically, the second circuit BL2 is formed of the PMOS transistor P5. A gate terminal of the PMOS transistor P5 is connected to the output terminal Y, and a source terminal thereof is connected to the source voltage VDDH, and a drain terminal thereof is connected to the node pwr.

The capacitor MC2 may be formed, for example, by connecting the source terminal and the drain terminal of a PMOS transistor. The capacitor MC2 is a decoupling capacitor, wherein a first terminal thereof is connected to the node pwr, and a second terminal thereof is connected to the source voltage VDDH.

Figure 3:
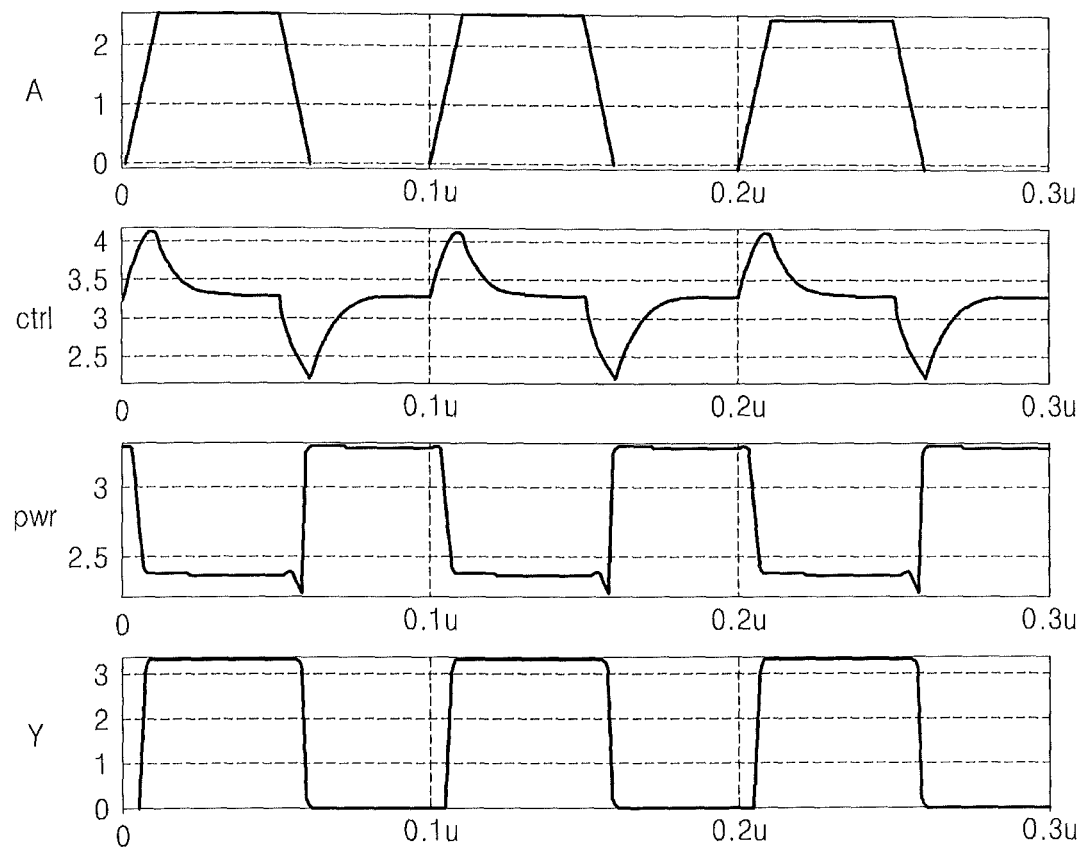
FIG. 3 is a waveform diagram of various signals generated in the level shifter of FIG. 2.

Hereinafter, operation of the circuit of FIG. 2 will be described in detail with reference to FIG. 3. FIG. 3 is a waveform diagram of four of the signals generated in the level shifter circuit of FIG. 2. In FIG. 3, the X-axis indicates time (seconds), and the Y-axis indicates a voltage (volt). A signal that swings from 0 V to a voltage VDDL is input to the input terminal A, where the voltage VDDL is lower than the source voltage VDDH.

Referring to FIG. 2, when the signal input to the input terminal A is maintained at the voltage VDDL, which is logic high, the NMOS transistor IN1 is turned on and a voltage of the node YB is 0 V. Accordingly, the PMOS transistor P2 is turned on, and the NMOS transistor N2 is turned off, and thus the voltage of the output terminal Y is raised to the source voltage VDDH by the PMOS transistor P2, as shown in the portions of the waveform diagrams of FIG. 3 where a signal at a high logic level is input to terminal A.

Also, in portions of the waveform diagrams of FIG. 3 where the signal input to the input terminal A is maintained at a high logic level, the PMOS transistor P3 is turned on (see FIG. 2), and the voltage of the node ctrl is thus raised to the source voltage VDDH, as shown in FIG. 3. Accordingly, the PMOS transistor P4 is turned off. Since the voltage of the output terminal Y is at the source voltage VDDH, the PMOS transistor P5 is also turned off.

Accordingly, in the portions of the waveform diagrams of FIG. 3 where the signal input to the input terminal A is maintained at a logic high level, the source voltage VDDH is not supplied to the node pwr, and thus a short circuit is not generated.

When the signal input to the input terminal A is transitioned from the voltage VDDL, which is logic high, to 0 V, which is logic low, the voltage of the node ctrl is also decreased, as illustrated in FIG. 3, due to the coupling effect of the capacitor MC1. When the voltage of the node ctrl is decreased, the PMOS transistor P4 is turned on, and the source voltage VDDH is supplied to the node pwr.

Accordingly, when the signal input to the input terminal A transitions to a low logic level (0 V), the PMOS transistor P1 is turned on, and the NMOS transistor N1 is turned off, and the voltage of the node YB is raised to of the source voltage VDDH. The PMOS transistor P2 is turned off by the voltage of the node YB, the NMOS transistor N2 is turned on, and the voltage of the output terminal Y is lowered to 0 V, as is also shown in FIG. 3.

Also, in portions of the waveform diagrams of FIG. 3 where the voltage of the output terminal Y is maintained at 0 V, the PMOS transistor P5 is turned on, and the voltage of the node pwr is maintained at the source voltage VDDH, as shown in FIG. 3. Accordingly, by raising the voltage of the node YB to the source voltage VDDH, the PMOS transistor P1 may stabilize a logical state of the output terminal Y while the signal applied to the input terminal A is maintained at the logic low level.

Accordingly, in the section where the signal input to the input terminal A is transitioned from a logic high level to a logic low level, the source voltage VDDH is supplied to the node pwr, and in the section where the signal input to the input terminal A is maintained at a logic low level, the voltage of the source voltage VDDH is supplied to the node pwr via the first circuit BL1.

The capacitor MC2 operates as a decoupling capacitor that reduces the possibility that the voltage of the node pwr decreases abruptly when the PMOS transistor P1 is turned on. Also, the capacitor MC2 may secondarily reduce the possibility of insufficient supply of power by the PMOS transistor P4.

Next, a display device including a level shifter according to an embodiment of the inventive concept will be described below. However, it will be appreciated that the level shifters according to embodiments of the present invention are not only applicable to display devices but may also be applied to other kinds of devices.

Figure 4:
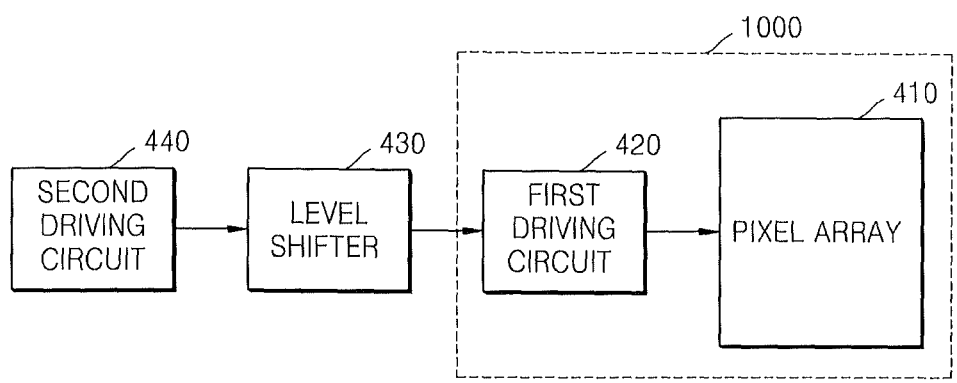
FIG. 4 is a block diagram illustrating a display device including a level shifter according to an embodiment of the inventive concept.

FIG. 4 is a block diagram illustrating a display device including a level shifter according to an embodiment of the inventive concept.

Referring to FIG. 4, the display device includes a pixel array 410, a first driving circuit 420, a level shifter 430, and a second driving circuit 440.

Here, a panel 1000 includes the pixel array 410 and the first driving circuit 420. According to another embodiment of the inventive concept, the level shifter 430 may also be included in the panel 1000.

In the pixel array 410, a plurality of data lines and a plurality of gate lines cross each other, and a plurality of transistors are formed at each of the crossing portions of the data lines and the gate lines for driving each cell. A thin-film transistor responds to a scan signal transmitted to a gate line, thereby supplying to a cell a pixel voltage supplied to a data line.

The first driving circuit 420 is one selected from the group consisting of a gate driving circuit for supplying a scan signal to the gate lines, a data driving circuit for converting digital video data to an analog pixel voltage to supply the same to the data lines, and a timing controller that controls the gate driving circuit and the data driving circuit and supplies a digital video signal to a data supplying circuit according to a clock signal.

The second driving circuit 440 generates a driving signal needed to drive the pixel array 410 in the panel 1000, that is, various control signals and video signals.

The level shifter 430 converts a level of a driving signal generated by the second driving circuit 440 to a voltage level at which the driving signal is operable in the first driving circuit 420, and level shifter circuits according to embodiments of the present invention such as, for example the level shifter circuits illustrated in FIG. 1 or FIG. 2, may be used as the level shifter 430.

Herein, references to a "source voltage terminal" refer to any terminal that is connected to a source voltage, and hence it will be understood that when multiple transistors, circuits and the like are connected to a "source voltage terminal" these transistors, circuits and the like may be commonly connected to the source voltage at the same point, may be connected to the same source voltage at different points and/or may be connected to different ones of multiple source voltages that have the same voltage level.

While the inventive concept has been particularly shown and described with reference to exemplary embodiments thereof, it will be understood that various changes in form and details may be made therein without departing from the spirit and scope of the following claims, and that the inventive concept are not limited thereto.

What is claimed is:

1. A level shifter comprising:
   a first circuit that is configured to block a supply of a source voltage to a first node when a signal input to an input terminal is maintained at a logic high level, and to supply the source voltage to the first node when the signal input to the input terminal transitions from a logic high level to a logic low level;
   a second circuit that is configured to supply the source voltage to the first node only when a voltage of an output terminal is maintained at a logic low level;
   a first inverter that uses the voltage supplied from the first node to generate a first output signal by reversing a logical level of the signal input to the input terminal and outputs the first output signal to a second node; and
   a second inverter that uses the source voltage to generate a second output signal by reversing the logical level of the first output signal that is output to the second node and outputs the second output signal to the output terminal,
   wherein the first circuit comprises:
   a first P-channel transistor comprising a source terminal connected to a source voltage terminal, a drain terminal connected to a third node, and a gate terminal connected to a terminal that is maintained at a logic low state;
   a second P-channel transistor comprising a source terminal connected to the source voltage terminal, a drain terminal connected to the first node, and a gate terminal connected to the third node; and
   a first capacitor comprising a first terminal connected to the input terminal, and a second terminal connected to the third node.

2. The level shifter of claim 1, wherein the terminal that is maintained at a logic low state comprises a ground terminal.

3. The level shifter of claim 2, wherein the second circuit comprises a third P-channel transistor comprising a source terminal connected to the source voltage terminal, a drain terminal connected to the first node, and a gate terminal connected to the output terminal.

4. The level shifter of claim 3, further comprising a second capacitor comprising a first terminal connected to the source voltage terminal and a second terminal connected to the first node.

5. The level shifter of claim 4, wherein the first inverter comprises:
   a fifth P-channel transistor comprising a gate terminal connected to the input terminal, a source terminal connected to the first node, and a drain terminal connected to the second node; and
   a first N-channel transistor comprising a gate terminal connected to the input terminal, a drain terminal connected to the second node, and a source terminal to the ground terminal.

6. The level shifter of claim 5, wherein the second inverter comprises:
   a fourth P-channel transistor comprising a gate terminal connected to the second node, a source terminal connected to the source voltage terminal, and a drain terminal connected to the output terminal; and
   a second N-channel transistor comprising a gate terminal connected to the second node, a drain terminal connected to the output terminal, and a source terminal connected to the ground terminal.

7. The level shifter of claim 1, wherein the second circuit comprises a third P-channel transistor comprising a source terminal connected to the source voltage terminal, a drain terminal connected to the first node, and a gate terminal connected to the output terminal.

8. The level shifter of claim 1, further comprising a second capacitor comprising a first terminal connected to the source voltage terminal and a second terminal connected to the first node.

9. The level shifter of claim 8, wherein the first capacitor and the second capacitor comprise metal-oxide-semiconductor (MOS) devices.

10. The level shifter of claim 1, wherein the first inverter comprises:
    a fifth P-channel transistor comprising a gate terminal connected to the input terminal, a source terminal connected to the first node, and a drain terminal connected to the second node; and
    a first N-channel transistor comprising a gate terminal connected to the input terminal, a drain terminal connected to the second node, and a source terminal to the ground terminal.

11. The level shifter of claim 1, wherein the second inverter comprises:
    a fourth P-channel transistor comprising a gate terminal connected to the second node, a source terminal connected to the source voltage terminal, and a drain terminal connected to the output terminal; and
    a second N-channel transistor comprising a gate terminal connected to the second node, a drain terminal connected to the output terminal, and a source terminal connected to the ground terminal.

12. A display device comprising:
    a panel comprising a plurality of pixel arrays and a first driving circuit for driving the plurality of pixel arrays;
    a second driving circuit generating a signal for driving the panel; and
    a level shifter that is configured to convert a voltage level of the signal generated by the second driving circuit to a voltage level appropriate for driving the first driving circuit, wherein the level shifter comprises:
- a first circuit that is configured to block a supply of a source voltage to a first node when a signal input to of an input terminal is maintained at a logic high level and to supply a source voltage to the first node when the signal input to the input terminal is transitions from a logic high level to a logic low level;
- a second circuit that is configured to supply the source voltage to the first node only when a voltage of an output terminal is maintained at a logic low level;
- a first inverter that uses the voltage supplied from the first node to generate a first output signal by reversing a logical level of the signal input to the input terminal and outputs the first output signal to a second node; and
- a second inverter that uses the source voltage to generate a second output signal by reversing the logical level of the first output signal that is output to the second node and outputs the second output signal to the output terminal, wherein the first circuit comprises:
- a first P-channel transistor comprising a source terminal connected to a source voltage terminal, a drain terminal connected to a third node, and a gate terminal connected to a terminal that is maintained at a logic low state;
- a second P-channel transistor comprising a source terminal connected to the source voltage terminal, a drain terminal to the first node, and a gate terminal to the third node; and
- a first capacitor comprising a first terminal connected to the input terminal, and a second terminal connected to the third node.

13. An electronic circuit, comprising:
an input terminal;
an output terminal;
- a first inverter comprising a first P-channel transistor having a source connected to a first node and a drain connected to a second node and a gate connected to the input terminal and a first N-channel transistor having a drain connected to the second node, a source connected to ground and a gate connected to the input terminal;
- a second inverter comprising a third P-channel transistor having a source connected to a source voltage terminal and a drain connected to the output terminal and a gate connected to the second node and a fourth N-channel transistor having a drain connected to the output terminal, a source connected to ground and a gate connected to the second node;
- a fifth transistor having a source connected to the source voltage terminal and a drain connected to the first node; and
- a sixth transistor having a source connected to the source voltage terminal and a drain connected to the first node;
wherein the fifth transistor comprises a P-channel transistor having a gate that is connected to a third node and wherein the sixth transistor comprises a P-channel transistor having a gate connected to the output terminal, the electronic circuit further comprising a seventh transistor having a source connected to the source voltage terminal, and a drain connected to the third node,
the circuit further comprising a first capacitor coupled between the input terminal and the third node.

14. The electronic circuit of claim 13, wherein the fifth transistor comprises an N-channel transistor having a gate that is connected to the source voltage terminal and wherein the sixth transistor comprises a P-channel transistor having a gate connected to the output terminal.

15. The electronic circuit of claim 13, further comprising a second capacitor coupled between the source voltage terminal and the first node.

* * * * *